United States Patent [19]

Grosset et al.

[11] Patent Number: 5,138,413
[45] Date of Patent: Aug. 11, 1992

[54] PISO ELECTROSTATIC DISCHARGE PROTECTION DEVICE

[75] Inventors: Mark A. Grosset, Piscataway, N.J.; Chuan-Ding A. Hsu, San Jose, Calif.

[73] Assignee: Harris Corporation, Melbourne, Fla.

[21] Appl. No.: 601,974

[22] Filed: Oct. 22, 1990

[51] Int. Cl.⁵ .................. H01L 29/90; H01L 29/06; H01L 29/72
[52] U.S. Cl. .................. 357/23.13; 357/13; 357/20; 357/35; 357/86; 361/91
[58] Field of Search .................. 357/13, 23.13, 34, 38, 357/86, 20, 35; 361/91

[56] References Cited

U.S. PATENT DOCUMENTS

| | | | |
|---|---|---|---|
| 3,667,009 | 5/1972 | Rugg | 357/23.13 |
| 3,817,794 | 6/1974 | Beadle et al. | 357/13 |
| 4,066,918 | 1/1978 | Heuner et al. | 307/304 |
| 4,312,524 | 3/1982 | Petrovic | 357/13 |
| 4,642,667 | 2/1987 | Magee | 357/35 |
| 4,736,271 | 4/1988 | Mack et al. | 361/91 |
| 4,757,363 | 7/1988 | Bohm et al. | 357/23.13 |
| 4,896,243 | 1/1990 | Chatterjee et al. | 362/91 |
| 4,903,095 | 2/1990 | Chapron | 357/23.13 |
| 4,922,371 | 5/1990 | Gray et al. | 361/91 |
| 4,975,751 | 12/1990 | Beasom | 357/13 |
| 5,021,858 | 6/1991 | Hall | 357/42 |

FOREIGN PATENT DOCUMENTS 56-79463  6/1981  Japan .................. 357/23.13

OTHER PUBLICATIONS

Yean-Shan Hu, et al., "High Density Input Protection Circuit Design In 1.2 um CMOS Technology" *1987 EOS/ESD Symposium Proceedings*, pp. 179–185.

McPhee, R. A., et al. "Thick Oxide Device ESD Performance Under Process Variations", *1986 EOS/ESD Symposium Proceedings*, pp. 173–181.

*Primary Examiner*—J. Carroll
*Attorney, Agent, or Firm*—Watov & Kipnes

[57] ABSTRACT

A semiconductor protection circuit comprises a semiconductor substrate of a first conductivity type; a first region of the first conductivity type formed in the substrate at a surface thereof and having a relatively different degree of conductivity from the substrate; a region of a second conductivity type formed in the first region of the first conductivity type; and a second region of the first conductivity type formed partly in each of the semiconductor substrate and the first region of the first conductivity type so as to bridge a junction therebetween.

12 Claims, 3 Drawing Sheets

PISO ELECTROSTATIC DISCHARGE PROTECTION DEVICE

FIELD OF THE INVENTION

The present invention relates to electrical protection devices, and more particularly to devices providing protection for monolithic integrated circuits against relatively large voltage transients.

BACKGROUND OF THE INVENTION

Integrated circuits (ICs) are incorporated in many types of electrical equipment. Such ICs are generally vulnerable to damage from high voltage transients.

A source of high voltage electrostatic discharge (ESD) transients can result from a user becoming electrostatically charged, for example, by friction or by induction and touching the controls of the equipment.

Consequently, high voltage transients may be coupled to the terminals of ICs utilized in electrical equipment. Thus, IC's may be damaged by high voltage transients conducted by way of terminals.

Protection devices and circuitry applicable to the protection of ICs from damage that would otherwise result from a high voltage transient are known in the art. Such devices are described in, for example, the following patents, the disclosure of which is herein incorporated by reference: U.S. Pat. No. 4,066,918, (Heuner et al.), issued Jan. 3, 1978; U.S. Pat. No. 4,736,271, (Mack et al.), issued Apr. 5, 1988; U.S. Pat. No. 4,757,363, (Bohm et al.), issued Jul. 12, 1988; U.S. Pat. No. 4,896,243, (Chatterjee et al.), issued Jan. 23, 1990; U.S. Pat. No. 4,903,095, (Chapron), issued Feb. 20, 1990; and U.S. Pat. No. 4,922,371, (Gray et al.), issued May 1, 1990. Protection devices and circuits are also described in, for example, "High Density Input Circuit Design In 1.2 $\mu$m CMOS Technology", Yean-Shan Hu et al., 1987 EOS/ESD SYMPOSIUM PROCEEDINGS, pages 179-185; and "Thick Oxide Device ESD Performance Under Process Variations", R. A. McPhee et al., 1986 EOS/ESD SYMPOSIUM PROCEEDINGS, PAGES 173-181.

It is herein recognized that in providing its protective function, it is desirable that the voltage at which a protection device exhibits a high level of conduction be sufficiently low, e.g. 15 volts, in order to provide significant protection of the device to be protected. On the other hand, a protection device should not exhibit a significant level of conduction below a voltage that is sufficiently high, e.g. 8 volts, in order to permit normal functioning of the device to be protected at normal operating voltages. It is also desirable that the protection device be able to handle transients associated with relatively large amounts of energy without itself being destroyed or having its protective capability significantly impaired. Furthermore, the protection device should exhibit fast turn-on and its structure should be compatible with the manufacturing process of the IC on which it is to be incorporated and preferably, it should not require any additional processing steps for its formation.

SUMMARY OF THE INVENTION

In accordance with an aspect of the invention, a semiconductor protection circuit comprises a semiconductor substrate of a first conductivity type; a first region of the first conductivity type formed in the substrate at a surface thereof and having a relatively different degree of conductivity from the substrate; a region of a second conductivity type formed in the region of the first conductivity type; a second region of the first conductivity type formed partly in each of the semiconductor substrate and the first region of the first conductivity type so as to bridge a junction therebetween.

In accordance with another aspect of the invention, the first region of the first conductivity type is doped at a concentration such that a junction between the region of the second conductivity type and the first region of the first conductivity type exhibits a smaller reverse breakdown voltage than is exhibited by a junction between the region of the second conductivity type and the semiconductor substrate.

In accordance with yet another aspect of the invention, the junction between the region of the second conductivity type and the first region of the first conductivity type exhibits a reverse breakdown voltage in the order of 14 Volts and the junction between the region of the second conductivity type and the semiconductor substrate exhibits a reverse breakdown voltage of in the order of 22 Volts.

In accordance with still another aspect of the invention a semiconductor protection circuit comprises a semiconductor substrate of a first conductivity type; a first region of the first conductivity type formed in the substrate at a surface thereof and having a relatively different degree of conductivity from the substrate; a second region of the first conductivity type formed at least partly in the first region of the first conductivity type.

In accordance with a further aspect of the invention, a semiconductor protection circuit comprises a semiconductor substrate of a first conductivity type; a first region of a second conductivity type formed in the substrate at a surface thereof; a first region of the first conductivity type formed in the first region of the second conductivity type and having a different degree of conductivity from the semiconductor substrate; a second region of the first conductivity type formed in the first region of the first conductivity type and having a higher degree of conductivity than the first region of the first conductivity type; and a second region of the second conductivity type formed in the first region of the second conductivity type and having a higher degree of conductivity than the first region of the second conductivity type, the second region of the second conductivity type being connected to the second region of the first conductivity type.

In accordance with still a further aspect of the invention, the first region of the first conductivity type is doped at a concentration such that a junction between the region of the second conductivity type and the first region of the first conductivity type exhibits a smaller reverse breakdown voltage than is exhibited by a junction between the region of the second conductivity type and the semiconductor substrate.

In accordance with yet a further aspect of the invention, a semiconductor protection circuit comprises a semiconductor substrate of P conductivity type; a region of N conductivity type formed in the semiconductor substrate at a surface thereof; a first region of P type isolation region (PISO region), as utilized in the CMOS 3 and CMOS 3.5 processes, formed in the region of N conductivity type; a first region of P+ conductivity type formed in the PISO region; a first region of N+ conductivity type formed in the region of N conductivity type; a second region of P+ conductivity type formed in the semiconductor substrate; a second region of the P type isolation region (PISO region), as utilized in the CMOS 3 and CMOS 3.5 processes, formed in the substrate at the surface thereof; a second region of N+ conductivity type formed in the PISO region; a third region of P+ conductivity type formed partly in each of the semiconductor substrate and the PISO region so as to bridge a junction therebetween; and a third region of N+ conductivity type formed in the PISO region in a location intermediate the third region of P+ conductivity type and the second region of N+ conductivity type.

In accordance with still yet a further aspect of the invention, the first region of P+ conductivity type, the first region of N+ conductivity type, and the second region of N+ conductivity type are connected to a terminal; and the second region of P+ conductivity type, the third region of P+ conductivity type, and the third region of N+ conductivity type are connected to a point of reference potential.

BRIEF DESCRIPTION OF THE DRAWING

Various embodiments of the invention are described below in greater detail, with reference to the drawing, in which like items are generally identified in the different figures by the same reference numeral, and in which.

DETAILED DESCRIPTION OF THE INVENTION

Figure 1:
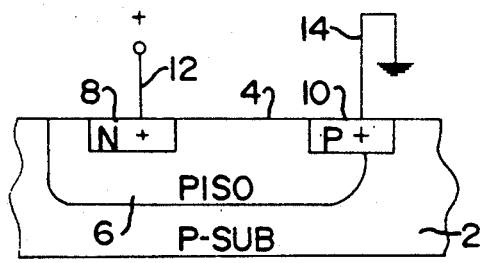
FIGS. 1 and 2 show cross-sections, not to scale, of protection devices in accordance with the present invention.

FIG. 1 shows a cross-sectional view of a semiconductor structure in accordance with an exemplary embodiment of the present invention, and typically forming part of an integrated circuit. It will be understood in the context of the following description that P-type and N-type conductivity materials are referred to as P and N materials, respectively. A P substrate 2, typically having a resistivity of 0.005–0.02 ohm-cm has a surface 4 having formed therein a P-well 6. P-well 6 is formed by a P region implant referred to as a P type isolation region or PISO region which is utilized in the CMOS 3 and CMOS 3.5 processes. Typically, PISO region 6 is formed by ion implantation of boron at, for example, 60 keV, 2.0 E13/cm$^2$, 1.0–1.1 $\mu$m (micrometer) deep. PISO well region 6 has formed therein an N+ region 8. PISO well region 6 has a P+ region 10 formed therein and bridging the junction between PISO well region 6 and P substrate region 2. Each of N+ region 8 and P+ region 10 is shallower than the depth of PISO region 6. It has been found that the diode formed by the junction of N+ region 8 and PISO region 6 exhibits a typical reverse breakdown voltage of about 14.0 Volts, whereas the reverse breakdown voltage for the diode formed by N+ region 8 and substrate 2 is typically about 22.0 Volts. Connections to regions 8 and 10 are provided by conductors 12 and 14, respectively. The structure shown in FIG. 1 is somewhat simplified in order to clarify the present description.

Figure 2:
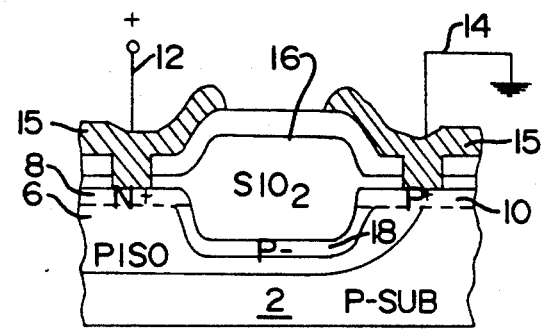

FIG. 2 shows a cross-sectional view which, while it is essentially equivalent to the structure shown in FIG. 1, corresponds more closely to the typical actual type of structure that is used in practice. The same reference numerals are used in FIGS. 1 and 2 to designate like or similar parts. In FIG. 2, 16 is a dielectric layer of silicon dioxide and 18 is a shallow P layer known as the field diffusion, typically utilized in CMOS structures. Metallization 15, typically Aluminum, is also shown for electrically connecting regions 8 and 10, to conductors 12 and 14, respectively. It will be understood that such structural details are generally also applicable to other structures described herein.

Figure 3:
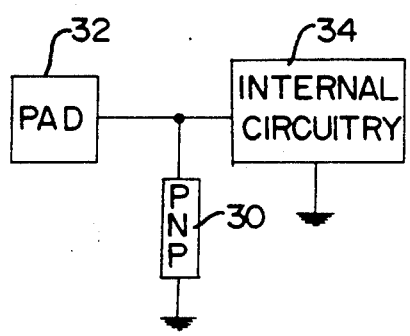
FIG. 3 shows a circuit schematic diagram of a protection device in accordance with the present invention.

FIG. 3 shows a protection arrangement in accordance with the invention, wherein a protection device 30, formed in an integrated circuit, is connected to a connection pad or bonding pad 32 and to circuitry to be protected 34, internal to the integrated circuit. Potentially damaging currents are shunted by protection device 30 so as to protect circuitry 34.

Figure 4:
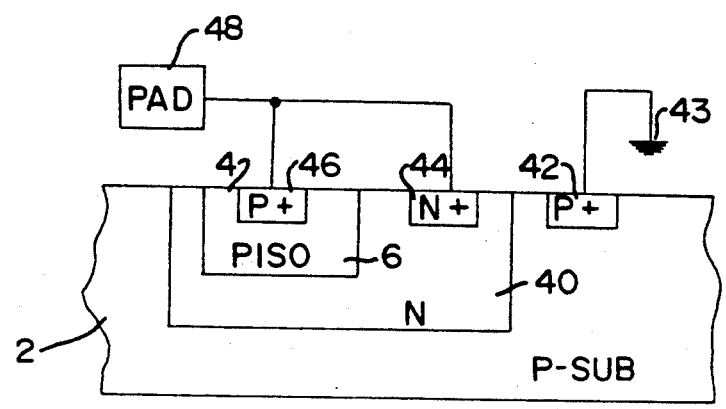
FIG. 4 shows a cross-section, not to scale, of a protection device in accordance with the present invention.

FIG. 4 shows details of protection device 30 in a cross-sectional view. P substrate 2 has formed therein at surface 4 an N-well region 40 and a P+ well region 42. N-well region 40 has formed therein a PISO well region 6 and a N+ region 44. PISO well region 6 has formed therein a P+ well region 46. A bond pad 48 is connected to P+ region 46 and to N+ region 44. P+ region 42 is connected to a source of a reference potential, here shown as ground 43, for example. N-well region 40 is shallower than substrate 2 and PISO well region 6 is shallower than N-well region 40. Regions 42, 44, and 46 are of comparable depth and are shallower than PISO well region 6. Typically, the spacing between the bottom of P+ region 46 and the bottom of PISO well region 6 is in the order of 0.8 $\mu$m (micrometer) and the spacing between the bottom of PISO well region 6 and the bottom of N-well 40 is in the order of 2.5 $\mu$m.

In operation, the structure shown in FIG. 4 forms a punch-through device. Punch-through is a phenomenon known to occur in bipolar transistors when the respective space charge regions of the collector and emitter junctions touch. It is characterized by the establishment of a conduction path capable of handling relatively large currents between the collector and emitter electrodes. In the present structure in accordance with the invention, the PISO well region 6 forms the emitter of a PNP transistor, N-well region 40 forms its base, and P substrate 2 the collector. Since the device is operated as a two-terminal device, it is herein referred to as a "vertical PISO punch-through diode", although it is in reality a diode-connected transistor. The base and emitter of the PNP transistor are connected together to form one electrode of the diode, the other electrode of the diode being formed by the collector. Punch-through in the structure in accordance with FIG. 4 is found to occur typically at about 11.0 Volts.

It is significant that this punch-through takes place at a lower voltage than breakdown due to avalanche breakdown. Typically, avalanche breakdown for the junction between N-well 40 and PISO well region 6 occurs at about 40.0 Volts and for the junction between N-well 40 and substrate 2 at about 45.0 Volts. Usually, the wider the base width of transistor, the higher will be the voltage at which punch-through takes place. As was stated, in the structure shown in FIG. 2, punch-through occurs at about 11.0 Volts. While the base width of 2.5 micrometer tends to raise the punch-through voltage, it is lowered by the doping level near the bottom of N-well 40 being relatively low as compared with the doping level near the surface. Thus, with a positive potential relative to ground applied to pad 48, the diode conducts in the punch-through mode at about 11 Volts. With a negative potential applied to pad 48, conduction takes place by way of a forward biased junction between substrate 2 and N-well 40.

As is known, punch-through devices are known for their relatively high current-carrying capability, or "current robustness". Thus, good electrostatic discharge (ESD) protection is provided by a vertical PISO punch-through diode as herein described. The degree of protection is improved by reducing the resistance of PISO well region 6 through higher doping concentration, and/or by adjusting the depth thereof, and/or by decreasing the resistance of the connection path to the substrate, for example, by increasing the number of substrate ties.

Figure 5:
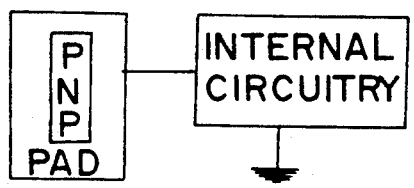
FIG. 5 shows a circuit schematic diagram of a protection device in accordance with the present invention.
Figure 6:
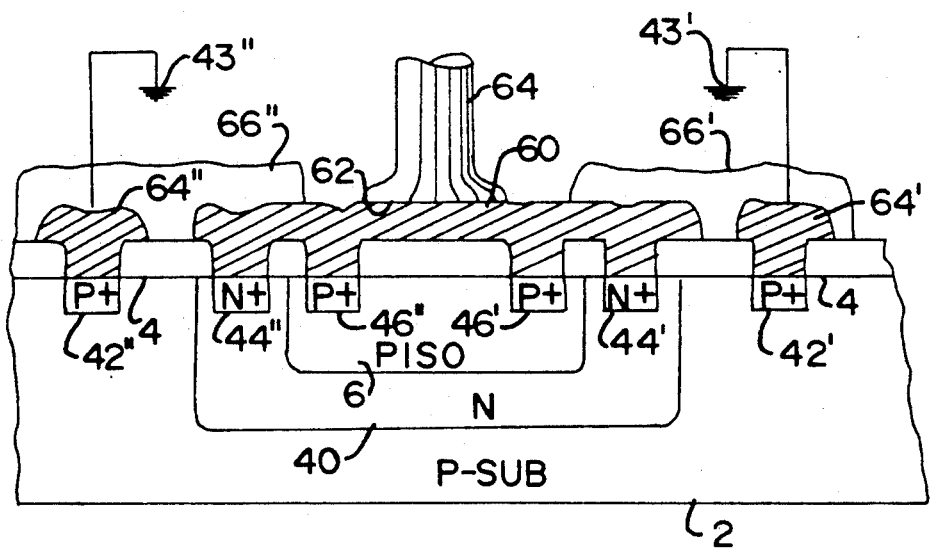
FIGS. 6 and 7 show cross-sections, not to scale, of a protection devices in accordance with the present invention.

In order to save area on the die or chip on which the integrated circuit to be protected is formed, a vertical PISO punch-through diode as herein described can be formed under a bond pad, as shown symbolically in FIG. 5. A cross-sectional view of a structure for realizing such an arrangement is shown in FIG. 6. P substrate 2 has formed therein at surface 4 an N-well region 40 and P+ well regions 42' and 42". N-well region 40 has formed therein a PISO well region 6 and N+ regions 44' and 44". PISO well region 6 has formed therein P+ well regions 46' and 46". A conductor, such as an aluminum or other metallic conductor 60 connects regions 44', 44", 46', 46", and forms a bond pad 62 or area for having a bond wire 64 bonded thereto. Regions 42' and 42" are connected to ground potential points 43' and 43" by way of conductors 64' and 64", respectively. An oxide layer 66' and 66" overlies conductors 60, 64', and 64".

In operation, the structure shown in FIG. 6 forms a punch-through device in which the PISO well region 6 forms the emitter of a PNP transistor, N-well region 40 forms its base, and P substrate 2 the collector. As in the above described FIG. 4 embodiment, the device is operated as a two-terminal device or vertical PISO punch-through diode, although it is in reality a diode-connected transistor. The base and emitter of the PNP transistor are connected together to form one electrode of the diode, the other electrode of the diode being formed by the collector. Punch-through in the structure in accordance with FIG. 6 is substantially the same as in the FIG. 4 device, that is, typically about 11 Volts.

Figure 7:
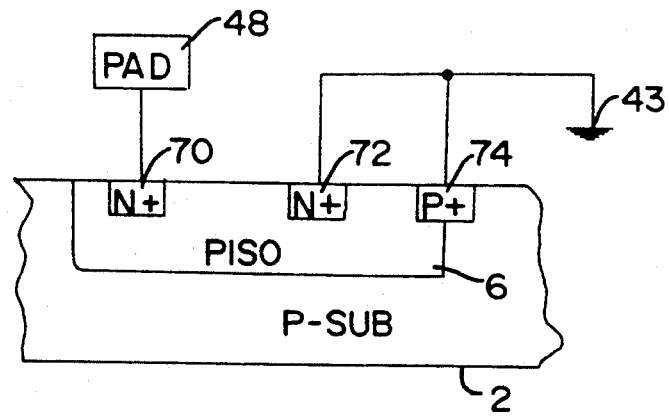

In another embodiment shown in FIG. 7, herein referred to as a PISO lateral NPN (LNPN) device, a P substrate 2 contains a PISO well region 6 as in the embodiments previously described. PISO region 6 has formed at the surface thereof N+ regions 70 and 2, and a P+ region 74 bridging the boundary between PISO well region 6 and P substrate 2. N+ region 70 is connected to a pad 48 and N+ region 72 and P+ region 74 are connected to a point of reference potential, here shown as a ground 43, for example. N+ region 70 forms the collector of a lateral NPN transistor whose base is formed by PISO well region 6 and whose emitter is formed by N+ region 72.

Figure 8:
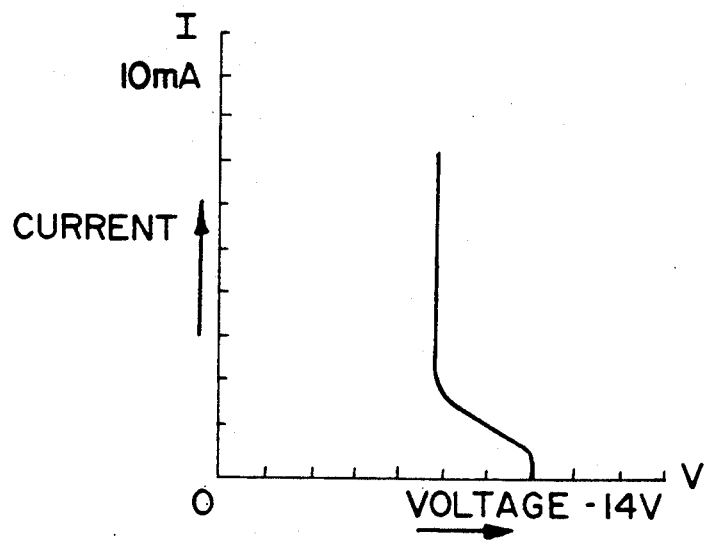
FIG. 8 shows a graph of an electrical characteristic of a device in accordance with the present invention.

In operation, when a sufficiently high positive voltage is applied to pad 48 and thereby to the collector, avalanche breakdown takes place at about 14.0 Volts. Holes drift to the emitter, thereby forward biasing the base emitter junction, that is, the junction between PISO well region 6 and N+ region 72. Electrons are thereby caused to be injected into the substrate 2. These electrons drift to the collector and thereby create a regenerative effect. As a result, a "snap-back" effect occurs, that is, the voltage drop across the device becomes smaller at a high current level. FIG. 8 shows such a characteristic.

In the absence of PISO well region 6 as a base region for the lateral NPN device, that is, with P substrate 2 forming the base region, snap-back does not occur until a level of about 22.0 Volts is reached, which is the level at which avalanche breakdown occurs between an N+ layer and the substrate 2. A protection device which does not conduct substantially until a level of 22.0 Volts is reached does not afford sufficient protection, for example, for the output buffers in present-day technologies. In the absence of effective protection, output buffers designed to be self-protecting so as to withstand electrostatic discharge use up excessive chip area. An output buffer is typically considered to be self-protecting if no protective clamp is provided for clamping the applied voltage to less than 15.0 Volts. The output buffer generally incorporates a lateral NPN transistor inherent to the N+ output region generally employed in such buffers, which causes conduction to begin due to a field effect at about 15.0 Volts and to snap back to about 10.0 Volts. By increasing the doping concentration in the PISO well region 6 and thereby lowering the avalanche breakdown point to less than 14 Volts, it is possible to design minimum size output buffers conforming to tight design rules and thereby effect savings in chip area.

Figure 9:
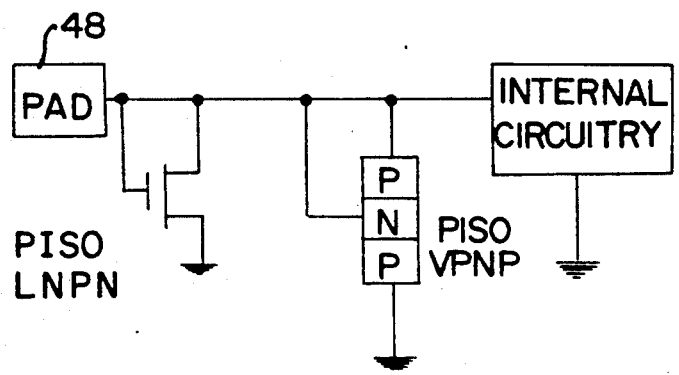
FIG. 9 shows a circuit schematic diagram of a protection device in accordance with the present invention.

FIG. 9 shows an embodiment wherein a punch-through device in accordance with the invention as earlier described is combined with an LNPN device as described above. A characteristic of this combination is that the punch-through device provides conduction at a level of about 11.0 Volts. Due to the resistive characteristic of the punch-through device, the voltage at pad 48 is able to rise to 14.0 Volts, whereupon the LNPN device becomes conductive and snaps back to a holding voltage of about 10.0 Volts. The pad voltage is thereby clamped to this voltage by the low voltage, high current characteristic previously described in connection with the LNPN device. With a negative voltage applied to pad 48, clamping occurs by a forward-biased junction as was previously described.

Various embodiments of the invention have been described above for purposes of illustration. However, such embodiments are not meant to be limiting, and those of ordinary skill in the art may recognize ways to modify such embodiments without departing from the fundamental concept of the invention, or departing from the spirit of the invention and the scope of the appended claims. For example, while the exemplary embodiment has been described in terms of particular conductivity types, converse conductivity types may be used so long as the relative conductivity types remain the same. While an embodiment of the invention can be fabricated utilizing ion implantation, standard photolithographic and etching steps for definition can also be utilized. The appended claims are meant to cover such modifications.

What I claim is:

1. A semiconductor protection circuit comprising:
a semiconductor substrate of a first conductivity type;
a first region of a second conductivity type formed in said substrate at a surface thereof;
a first region of said first conductivity type formed in said first region of said second conductivity type and having a different degree of conductivity from said semiconductor substrate;
a second region of said first conductivity type formed in said first region of said first conductivity type and having a higher degree of conductivity than said first region of said first conductivity type; and
a second region of said second conductivity type formed in said first region of said second conductivity type and having a higher degree of conductivity than said first region of said second conductivity type, said second region of said second conductivity type being connected to said second region of said first conductivity type.

2. A semiconductor protection circuit in accordance with claim 1, wherein said first region of said first conductivity type is doped at a concentration such that a junction between said second region of said second conductivity type and said first region of said first conductivity type exhibits a smaller reverse breakdown voltage than is exhibited by a junction between said second region of said second conductivity type and said semiconductor substrate.

3. A semiconductor protection circuit in accordance with claim 2, wherein said junction between said second region of said second conductivity type and said first region of said first conductivity type exhibits a reverse breakdown voltage in the order of 14 Volts, and wherein said junction between said second region of said second conductivity type and said semiconductor substrate exhibits a reverse breakdown voltage of in the order of 22 Volts.

4. A semiconductor protection circuit in accordance with claim 1, wherein said first region of said first conductivity type is doped at a concentration such that a junction between said second region of said second conductivity type and said first region of said first conductivity type exhibits a reverse breakdown voltage smaller by an amount in the order of 8 Volts than is exhibited by a junction between said second region of said second conductivity type and said semiconductor substrate.

5. A semiconductor protection circuit in accordance with claim 1, comprising:
a third region of said first semiconductor type formed in said semiconductor substrate.

6. A semiconductor protection circuit in accordance with claim 5, wherein said second region of said first conductivity type is connected to terminal and said third region of said first semiconductor type is connected to a point of reference potential.

7. A semiconductor protection circuit in accordance with claim 1, wherein a space charge region of said semiconductor substrate and said first region of said first conductivity type touch before avalanche breakdown takes place between said first region of said second conductivity type and said semiconductor substrate.

8. A semiconductor protection circuit in accordance with claim 7, wherein said space charge regions of said semiconductor substrate and said first region of said first conductivity type touch at about 11.0 volts, and the avalanche breakdown between said first region of said second conductivity type and said semiconductor substrate occurs at about 45.0 volts.

9. A semiconductor protection circuit comprising:
a semiconductor substrate of P conductivity type;
a region of N conductivity type formed in said semiconductor substrate at a surface thereof;
a region of P type isolation region (PISO region), as utilized in the CMOS 3 and CMOS 3.5 processes, formed in said region of N conductivity type;
a first region of P+ conductivity type formed in said PISO region;
a region of N+ conductivity type formed in said region of N conductivity type, said first region of P+ conductivity type and said region of N+ conductivity type being connected to a terminal; and
a second region of P+ conductivity type formed in said semiconductor substrate, said second region of P+ conductivity type being connected to a point of reference potential.

10. A semiconductor protection circuit comprising:
a semiconductor substrate of P conductivity type;
a region of N conductivity type formed in said semiconductor substrate at a surface thereof;
a first region of P type isolation region (PISO region), as utilized in the CMOS 3 and CMOS 3.5 processes, formed in said region of N conductivity type;
a first region of P+ conductivity type formed in said first PISO region;
a first region of N+ conductivity type formed in said region of N conductivity type;
a second region of P+ conductivity type formed in said semiconductor substrate;
a second region of said P type isolation region (PISO region), as utilized in the CMOS 3 and CMOS 3.5 processes, formed in said substrate at said surface thereof;
a second region of N+ conductivity type formed in said second PISO region;
a third region of P+ conductivity type formed partly in each of said semiconductor substrate and said second PISO region so as to bridge a junction therebetween; and
a third region of N+ conductivity type formed in said second PISO region in a location intermediate said third region of P+ conductivity type and said second region of N+ conductivity type.

11. A semiconductor protection circuit as recited in claim 10, wherein said first and second regions of P type isolation region (PISO region) are formed by ion implantation of boron at in the order of 60 keV, 2.0 E13/cm², 1.0–1.1 μm deep.

12. A semiconductor protection circuit as recited in claim 10, wherein
said first region of P+ conductivity type, said first region of N+ conductivity type, and said second region of N+ conductivity type are connected to a terminal; and
said second region of P+ conductivity type, said third region of P+ conductivity type, and said third region of N+ conductivity type are connected to a point of reference potential.

* * * * *